United States Patent
Lee

(10) Patent No.: US 7,956,642 B2
(45) Date of Patent: Jun. 7, 2011

(54) LEVEL SHIFTER HAVING LOW DUTY CYCLE DISTORTION

(75) Inventor: ChulKyu Lee, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 11/768,300

(22) Filed: Jun. 26, 2007

(65) Prior Publication Data

US 2009/0002027 A1    Jan. 1, 2009

(51) Int. Cl.
*H03K 19/094* (2006.01)
*H03L 5/00* (2006.01)

(52) U.S. Cl. .................................. 326/68; 327/333

(58) Field of Classification Search .................... 326/68, 326/80, 82, 86, 87, 112, 115, 126, 127; 327/108, 327/109, 333

See application file for complete search history.

(56) References Cited

U.S. PATENT DOCUMENTS

| | | | | |
|---|---|---|---|---|
| 4,532,436 A | * | 7/1985 | Bismarck | 327/208 |
| 4,532,463 A | * | 7/1985 | Tanaka | 318/616 |
| 4,980,583 A | * | 12/1990 | Dietz | 326/68 |
| 5,781,026 A | | 7/1998 | Chow | |
| 6,002,290 A | * | 12/1999 | Avery et al. | 327/333 |
| 6,445,210 B2 | * | 9/2002 | Nojiri | 326/68 |
| 6,700,429 B2 | * | 3/2004 | Kanno et al. | 327/333 |
| 6,777,981 B2 | * | 8/2004 | Kobayashi | 326/81 |
| 6,777,992 B2 | | 8/2004 | Ziesler et al. | |
| 7,245,153 B2 | | 7/2007 | Murakami | |
| 7,375,574 B2 | | 5/2008 | Kanno et al. | |
| 2007/0290735 A1 | * | 12/2007 | Ali et al. | 327/333 |

OTHER PUBLICATIONS

International Search Report—PCT/US08/068247, International Search Authority—European Patent Office, Sep. 15, 2008.
Written Opinion—PCT/US08/068247, International Search Authority—European Patent Office, Sep. 15, 2008.

* cited by examiner

*Primary Examiner* — Vibol Tan
*Assistant Examiner* — Dylan White
(74) *Attorney, Agent, or Firm* — Howard H. Seo

(57) ABSTRACT

A level shifter includes an inverting circuit, a cross-coupled level shifting latch, and a SR logic gate latch. The first and second outputs of the level shifting latch are coupled to the set (S) and reset (R) inputs of the SR latch. The inverting circuit, that is powered by a first supply voltage VDDL, supplies a noninverted version of an input signal onto a first input of the level shifting latch and supplies an inverted version of the input signal onto a second input of the level shifting latch. A low-to-high transition of the input signal resets the SR latch, whereas a high-to-low transition sets the SR latch. Duty cycle distortion skew of the level shifter is less than fifty picoseconds over voltage, process and temperature corners, and the level shifter has a supply voltage margin of more than one quarter of a nominal value of VDDL.

20 Claims, 5 Drawing Sheets

US 7,956,642 B2

LEVEL SHIFTER HAVING LOW DUTY CYCLE DISTORTION

BACKGROUND INFORMATION

1. Technical Field

The disclosed embodiments relate to level shifting circuits, and more particularly relate to high speed level shifting circuits that exhibit both low duty cycle distortion and high supply voltage margin.

2. Background Information

Digital logic circuits can be powered from different supply voltages. In one example, an integrated circuit includes a first digital logic block that operates with a first supply voltage as well as a second digital logic block that operates with a second supply voltage. If a digital signal is to pass form one logic block to the other, the digital levels of the signal must be shifted. A circuit referred to as a level shifter is sometimes used to perform this level shifting function.

FIG. 1 (Prior Art) is a circuit diagram of a conventional level shifter 1. The label VDDL designates a first supply voltage (for example, 1.2 volts) whereas the label VDDH designates a second supply voltage (for example, 1.8 volts). If a digital input signal IN on input node 2 transitions from a digital low logic level (for example, ground potential or approximately ground potential) to a digital high logic level (for example, VDDL or approximately VDDL), then inverter 3 causes the signal on node 4 to transition low, and inverter 5 causes the signal on node 6 to transition high (to VDDL), and inverter 7 causes the signal on node 8 to transition low (to ground potential). The signal on node 6 transitioning to VDDL causes thick-gate insulator N-channel transistor 9 to turn on. The signal on node 8 transitioning to ground potential causes thick-gate insulator N-channel transistor 10 to turn off. Transistor 9 being turned on pulls the voltage on node 11 down to ground potential, and therefore causes thick-gate insulator P-channel transistor 12 to turn on. Transistor 10 being turned off allows conductive transistor 12 to pull the voltage on node 13 up toward the second supply voltage VDDH. The high voltage on node 13 causes thick-gate insulator P-channel transistor 14 to be turned off. It is therefore seen that the low-to-high transition from ground potential to VDDL on input node 2 is shifted into a low-to-high transition from ground potential to VDDH on node 13. The digital signal on node 13 passes through two inverters 15 and 16 in this example and is then buffered by yet another buffer 17 before the signal on node 18 is used by the second digital logic block that operates with the second supply voltage VDDH.

The level shifting circuit of FIG. 1 works well in many applications, but as signal speeds increase, the level shifting circuit is seen to introduce an undesirable amount of duty cycle distortion skew into the signal. A low-to-high signal transition has a first propagation delay (TPD_LH) through the circuit whereas a high-to-low signal transition has a second propagation delay (TDP_HL) through the circuit. The high-to-low propagation delay time is significantly affected by how fast N-channel transistor 10 can pull the voltage on node 13 down and switch the signal on node 13. The low-to-high propagation delay time is significantly affected by how fast P-channel transistor 12 can pull the voltage on node 13 up and switch the signal on node 13. The sizes of transistors 10 and 12 can be adjusted so that there is little or no skew at a certain set of operating voltage, process and temperature conditions. Unfortunately, as the operating voltages, process and temperature of the circuit vary, the low-to-high and high-to-low propagation delay times differ from one another.

In one example, a level shifter circuit is desired that will conduct 400 MHz digital signals. If, for example, the signal being level shifted is a data signal being communicated from a transmitter circuit to a receiver circuit synchronously with a clock signal, and if the time that the signal arrives at the receiver varies, then the rate at which the clock signal can be clocked is reduced. The clock signal cannot transition to clock data into the receiver until the data has been received at the receiver. In the 400 MHz signal application, a circuit specification requires that if a square wave is supplied as an input to the level shifting circuit, then the level shifted signal that is output from the circuit must have a duty cycle of no less than thirty percent and must have a duty cycle of no more than seventy percent over all permutations of voltage, process and temperature corners. Unfortunately, the circuit of FIG. 1 can have a duty cycle distortion greater than this.

FIG. 2 is a waveform diagram that illustrates how a 50/50 duty cycle 400 MHz input signal IN that is input to the circuit of FIG. 1 is level shifted into an output signal OUT that has an 80/20 duty cycle. This is more duty cycle distortion than is allowed by the circuit specification. An improved circuit is desired.

SUMMARY

A novel level shifter circuit receives a digital input signal IN that transitions within a first signal voltage range (for example, from ground potential to a first supply voltage VDDL of approximately 1.2 volts) and translates the signal IN into a digital output signal OUT that transitions within a second voltage range (for example, from the ground potential to a second supply voltage VDDH of approximately 1.8 volts). The level shifter circuit includes an inverting circuit, a cross-coupled level shifting latch, and a SR logic gate latch.

The inverting circuit receives the digital input signal IN and outputs an inverted version of the signal and a noninverted version of the signal. The inverting circuit is powered from the first supply voltage VDDL such that both the inverted and noninverted versions of the signal transition within the first signal voltage range.

The cross-coupled level shifting latch has a first input node, a second input node, a first differential output node and a second differential output node. The cross-coupled level shifting latch is powered by the second supply voltage VDDH such that signals output onto the first and second differential output nodes transition within the second signal voltage range. The first input node of the cross-coupled level shifting latch is coupled to receive the noninverted signal from the inverting circuit, whereas the second input node of the cross-coupled level shifting latch is coupled to receive the inverted signal from the inverting circuit.

The SR logic gate latch, that is also powered by the second supply voltage VDDH, has a set (S) input node, a reset (R) input node, and an output node. The set input node is coupled to the first differential output node of the cross-coupled level shifting latch, whereas the reset input node is coupled to the second differential output node of the cross-coupled level shifting latch. The output node of the SR logic gate latch outputs a digital output signal that is inverted to generate the digital output signal OUT. The digital output signal OUT transitions in the second voltage range.

In operation, a low-to-high transition of the digital input signal IN causes the cross-coupled level shifting latch to be set into a first state which in turn causes the cross-coupled level shifting latch to output a high signal onto one of its differential output nodes. The high signal resets the SR latch such that the digital signal OUT transitions from a digital logic low to a digital logic high. A high-to-low transition of the digital input signal IN causes the cross-coupled level shifting latch to be set into a second state which in turn causes the cross-coupled level shifting latch to output a high signal onto the other of its differential output nodes. The high signal sets the SR latch such that the digital signal OUT transitions from a digital logic low to a digital logic high.

The propagation delay through the level shifter circuit for a low-to-high transition of the input signal IN differs from the propagation delay through the level shifter circuit for a high-to-low transition of the input signal IN by an amount of time referred to here as the "duty cycle distortion skew". In one example, the duty cycle distortion skew is less than 50 picoseconds over operating voltage, process and operating temperature corners, when the level shifter circuit has a supply voltage margin of more than one quarter of a nominal 1.2 volt value of the first supply voltage VDDL. Due to the architecture of the level shifter circuit, the low duty cycle distortion skew is achieved without having to balance operating characteristics of the P-channel and an N-channel transistors within the cross-coupled level shifting latch. Because P-channel and N-channel transistors within the cross-coupled level shifting latch do not have to be balanced, the size of the N-channel transistors can be increased relative to the P-channel transistors, thereby increasing the supply voltage margin of the level shifter circuit.

The foregoing is a summary and thus contains, by necessity, simplifications, generalizations and omissions of detail; consequently, those skilled in the art will appreciate that the summary is illustrative only and does not purport to be limiting in any way. Other aspects, inventive features, and advantages of the devices and/or processes described herein, as defined solely by the claims, will become apparent in the non-limiting detailed description set forth herein.

DETAILED DESCRIPTION

Figure 3:
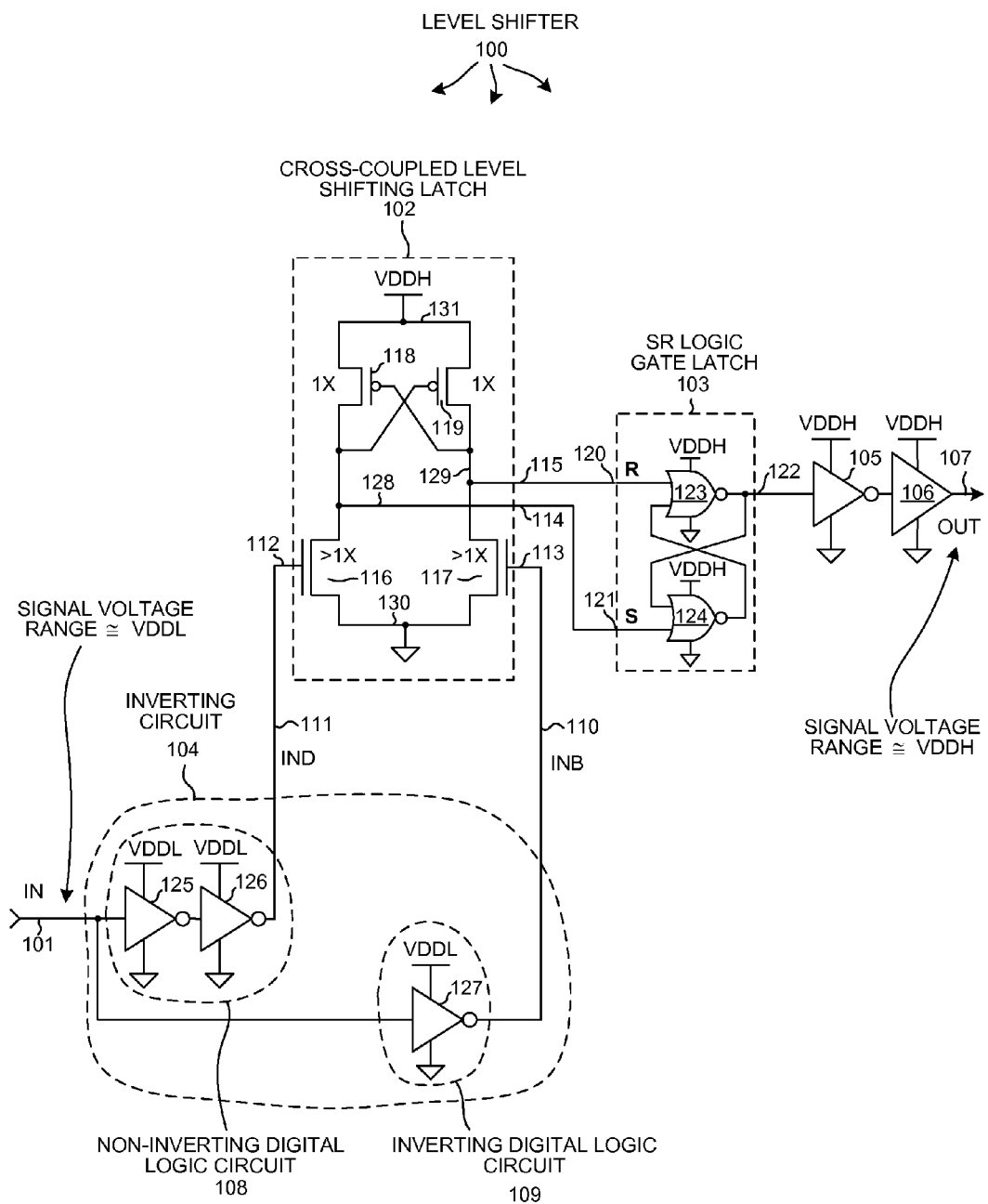
FIG. 3 is a circuit diagram of a novel level shifter circuit 100 in accordance with one novel aspect.

FIG. 3 is a simplified diagram of a level shifting circuit 100 in accordance with one novel aspect. Level shifting circuit 100 includes an input node 101, a cross-coupled level shifting latch 102, a set-reset (SR) logic gate latch 103, an inverting circuit 104, an inverter 105, a buffer 106, and an output node 107. A digital input signal IN is received onto input node 101 and is level shifted and output as a digital output signal OUT onto output node 107. Digital input signal IN transitions within a first signal voltage range (for example, from ground potential to a VDDL voltage of approximately 1.2 volts). Digital output signal OUT transitions within a second signal voltage range (for example, from the ground potential to a VDDH voltage of approximately 1.8 volts). Level shifting circuit 100 is realized in complementary logic involving P-channel and N-channel field effect transistors.

Inverting circuit 104 includes a non-inverting digital logic circuit 108 and an inverting digital logic circuit 109. Non-inverting digital logic circuit 108 includes two inverters 125 and 126. Inverting digital logic circuit 109 is a single inverter 127. Inverting circuit 104 is powered by a first power supply voltage VDDL (for example, 1.2 volts). Inverting circuit 104 supplies an inverted version of input signal IN onto node 110 as signal INB. The "B" in the signal name INB indicates "bar". Inverting circuit 104 also supplies a non-inverted version of input signal IN onto node 111 as signal IND. The "D" in the signal name IND indicates "delayed".

Cross coupled level shifting latch 102 includes a first input node 112, a second input node 113, a first differential output node 114, a second differential output node 115, two thick-gate insulator N-channel transistors 116 and 117, and two thick-gate insulator P-channel transistors 118 and 119. The cross-coupled level shifting latch 102 is powered by a second power supply voltage VDDH (for example, 1.8 volts).

SR logic gate latch 103 is also powered by the second power supply voltage VDDH. SR logic gate latch 103 includes a set (S) input node 121, a reset (R) input node 120, an output node 122, a first NOR gate 123 and a second NOR gate 124. The term "differential" here does not mean that information is necessarily communicated as a voltage difference between two signals, but rather includes a situation in which two signals are used to control a receiver circuit such as the SR logic gate latch 103: one to cause the SR logic gate latch to be set, and another to cause the SR logic gate latch to be reset.

Figure 4:
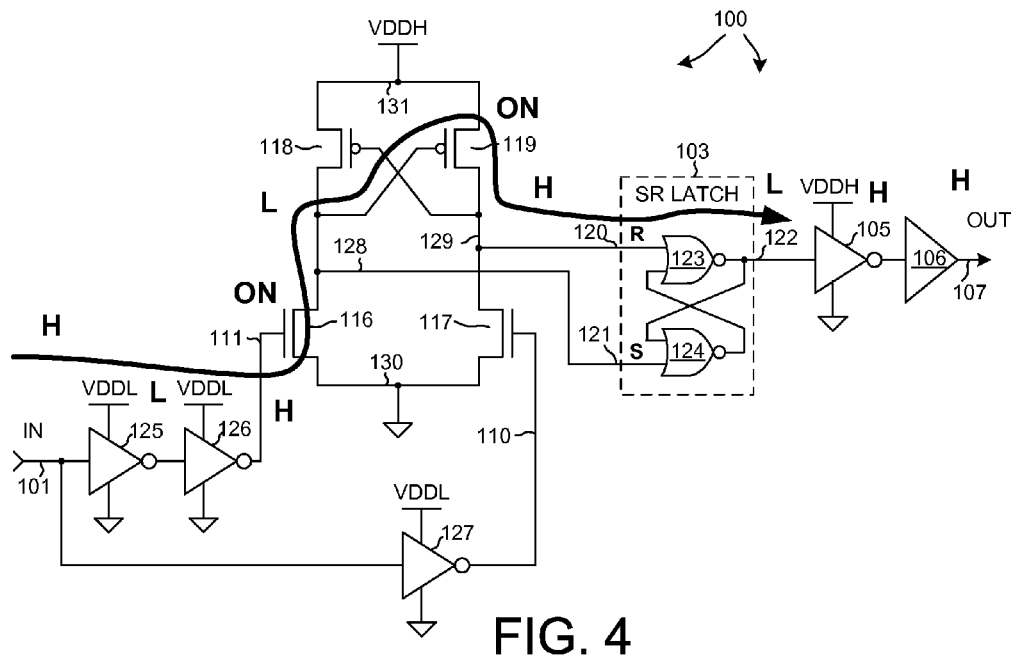
FIG. 4 is a circuit diagram that illustrates operation of the novel level shifter circuit 100 of FIG. 3 when a low-to-high transition of an input signal propagates through the level shifter circuit.

FIG. 4 illustrates an operation of level shifting circuit 100 when the input signal IN on input node 101 transitions from a digital low logic level (for example, ground potential or close to ground potential) to a digital high logic level (for example, supply voltage VDDL or close to VDDL). Initially, a digital logic low is present on input node 101. The signal on node 111 is therefore a digital logic low and the signal on node 110 is a digital logic high. The digital logic low on node 111 causes N-channel transistor 116 to be nonconductive and the digital logic high on node 110 causes N-channel transistor 117 to be conductive. P-channel transistor 119 is therefore nonconductive and P-channel transistor 118 is conductive. N-channel transistor 116 being nonconductive and P-channel transistor 118 being conductive causes a digital logic high to be present on node 128. N-channel transistor 117 being conductive and P-channel transistor 119 being nonconductive causes a digital logic low to be present on node 129. Because a digital logic high is present on node 128, a digital logic high is present on the lower input lead of NOR gate 124. NOR gate 124 therefore outputs a digital logic low signal onto the lower input lead of NOR gate 123. Because digital logic low signals are present on both input leads of NOR gate 123, NOR gate 123 outputs a digital logic high signal. The signal OUT on output node 107 is therefore a digital logic low. Because the input signal IN being a digital logic low causes the output signal OUT to be a digital logic low, the level shifter 100 is a noninverting level shifter circuit.

The transition of the input signal IN to a digital logic high causes the signal on node 111 to transition high and causes the signal on node 110 to transition low. N-channel transistor 116 is made conductive as indicated by the notation "ON" in FIG. 4. N-channel transistor 116 couples node 128 to ground node 130. N-channel transistor 117 is made nonconductive. The cross-coupled shifting latch 102 therefore switches, and P-channel transistor 119 is made conductive. P-channel transistor 119 couples node 129 to supply voltage node 131. The signal on node 129 therefore transitions to a digital logic high. The digital logic high on the upper input lead of NOR gate 123 causes NOR gate 123 to output a digital logic low signal. Because a digital logic low signal is now present on the lower input lead of NOR gate 124, digital logic low signals are present on both input leads of NOR gate 124. The state of SR logic gate latch therefore switches. The SR latch 103, that is now outputting a digital logic low onto output node 122, is said to have been "RESET". Because the signal on output node 122 transitions to a digital logic low, the signal OUT on output node 107 transitions to a digital logic high. The signal path through the circuit is illustrated by the heavy arrow in FIG. 4. In this operation, the SR latch 103 is "RESET" due to the digital logic high signal that is output onto second differential output lead 115 (see FIG. 3) of the cross-coupled level shifting latch 102.

Figure 5:
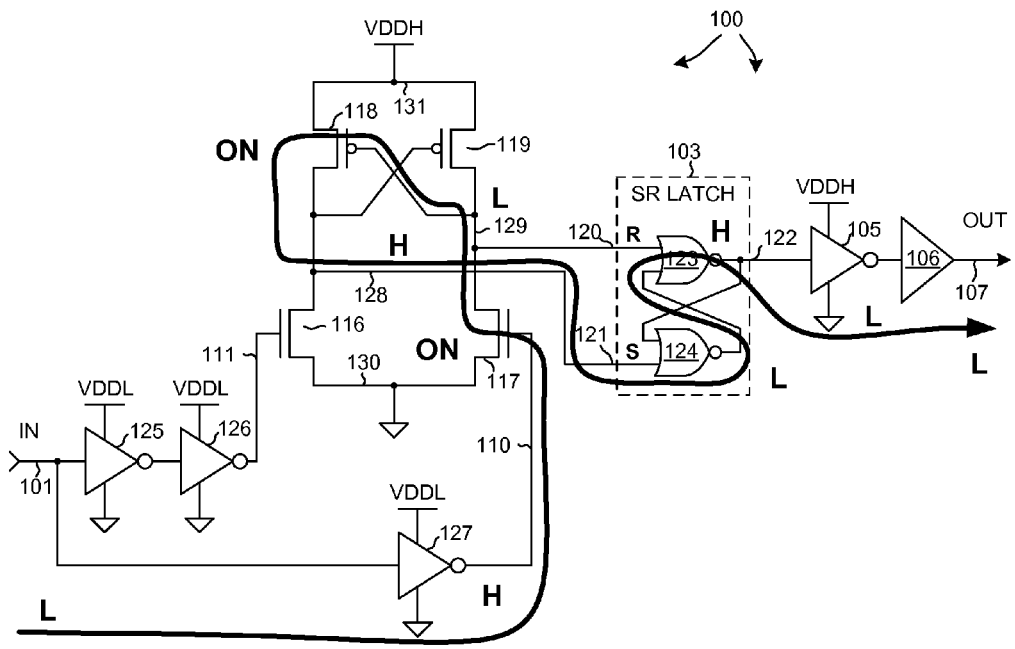
FIG. 5 is a circuit diagram that illustrates operation of the novel level shifter circuit 100 of FIG. 3 when a high-to-low transition of an input signal propagates through the level shifter circuit.

FIG. 5 illustrates operation of level shifting circuit 100 when the input signal IN on input node 101 transitions back from a digital logic high to a digital logic low. The transition on input node 101 causes the signal on node 110 to transition to a digital logic high, which in turn causes N-channel transistor 117 to be made conductive. N-channel transistor 117 being conductive is indicated by the "ON" notation in FIG. 5. N-channel transistor 117 couples node 129 to ground node 130 such that the voltage on node 129 transitions to a digital logic low. The signal on node 111 also transitions to a digital logic low, which in turn causes N-channel transistor 116 to be made nonconductive. The digital logic low signal on node 129 causes P-channel transistor 118 to be made conductive. P-channel transistor 118 being conductive couples node 128 to supply voltage node 131. The signal on node 128 therefore transitions to a digital logic high. Accordingly, cross-coupled level shifting latch 102 has switched states. A digital logic high is now present on the first differential output node 114 of the latch 102. The digital logic high signal on the set "S" input lead 121 of SR logic gate latch 103 causes NOR gate 124 to output a digital logic low signal. Because digital logic low signals are present on both input leads of NOR gate 123, the signal on the output lead of NOR gate 123 transitions to a digital logic high. SR logic gate latch 103 is therefore seen to have switched states. Because the signal on the output lead of NOR gate 123 transitions to a digital logic high, the SR logic gate latch 103 is set to have been 'SET". The setting of SR logic gate latch 103 causes the signal OUT on output node 107 to transition to a digital logic low. The signal path through the circuit is illustrated by the heavy arrow in FIG. 5.

The transistors of cross-coupled level shifting latch 100 are sized such that the low-to-high transition of the signal on each of the nodes 128 and 129 (the first and second differential output nodes of the cross-coupled level shifting latch 102) is slower than its high-to-low transition. Because SR latch 103 is either set or reset by a digital logic high signal, the high-to-low propagation through the SR latch is made to be faster than the low-to-high propagation through the SR latch so that both the set and reset input nodes of the SR latch will not experience simultaneous digital logic high signals. The signal begins to propagate through the SR latch 103 when a low-to-high transition on one of the differential output nodes of the cross-coupled level shifting latch 102 occurs.

It is desired that the propagation delays of the paths illustrated in FIGS. 4 and 5 be as close to one another as possible under all permutations of voltage, process and temperature corners. Note that in the arrow of FIG. 4, the signal passes through two inverters 125 and 126, an N-channel pulldown transistor 116 of latch 102, a P-channel pullup transistor 119 of latch 102, a NOR gate 123, and then the inverter 105 and buffer 106. In the arrow of FIG. 5, the signal passes through one inverter 127, an N-channel pulldown transistor 117 of latch 102, a P-channel pullup transistor 118 of latch 102, two NOR gates 124 and 123 of latch 103, and then the inverter 105 and buffer 106. It is therefore seen that the arrow of FIG. 5 passes through one more NOR gate than the arrow of FIG. 4, but passes through one less inverter. Accordingly, to match the low-to-high and high-to-low propagation delays of the circuit, the propagation delay of NOR gate 124 is made to be substantially equal to the propagation delay through inverter 125.

Figure 1:
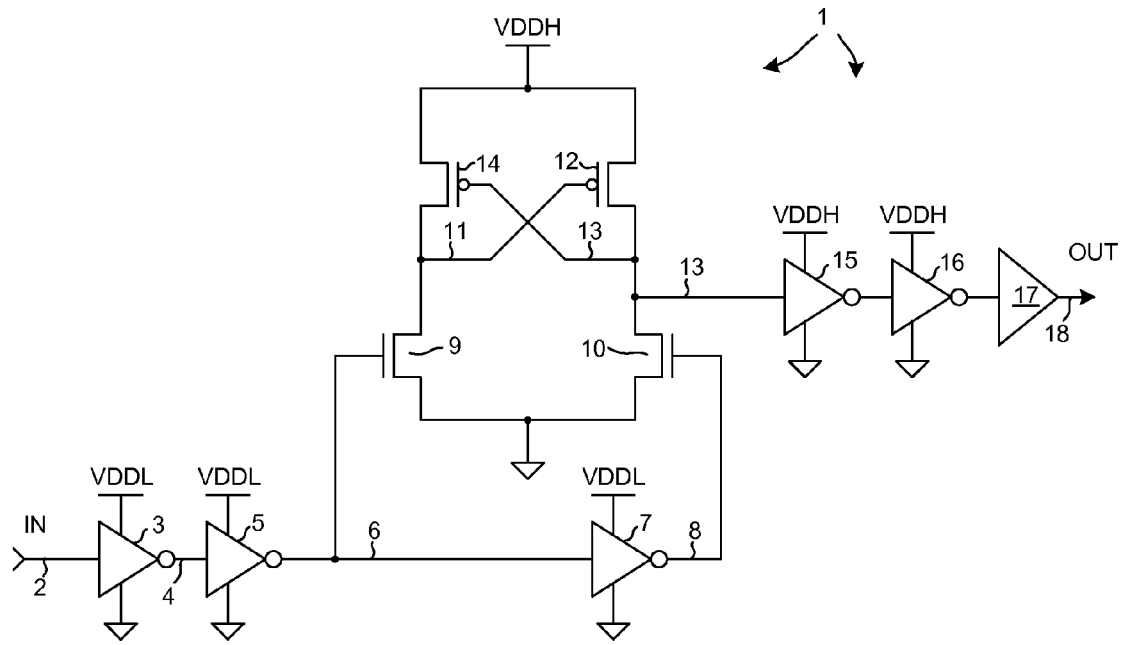
FIG. 1 (Prior Art) is a diagram of a prior art level shifter circuit.
Figure 2:
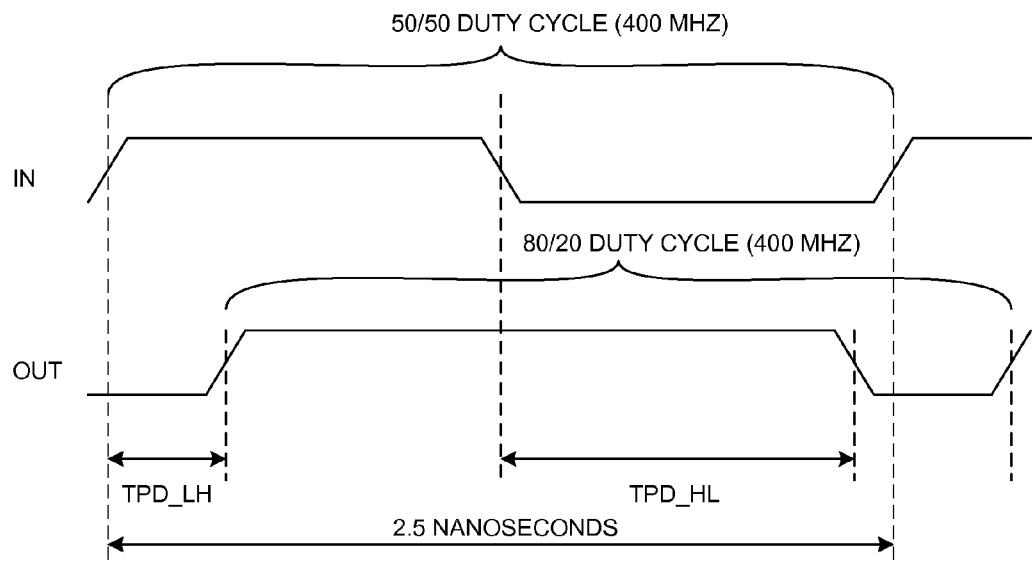
FIG. 2 (Prior Art) is a waveform diagram that illustrates duty cycle distortion introduced by the prior art level shifter circuit of FIG. 1.

In the prior art level shifter 1 of FIG. 1, a low-to-high transition of the input signal IN results in N-channel transistor 10 being made nonconductive and P-channel transistor 12 being made conductive. The rate at which the voltage on node 13 transitions high therefore depends upon the ability of P-channel transistor 12 to pull the voltage on node 13 up to supply voltage VDDH. In contrast, a high-to-low transition of the input signal IN results in N-channel transistor 10 being made conductive and P-channel transistor 12 being made nonconductive. The rate at which the voltage on node 13 transitions low therefore depends upon the ability of N-channel transistor 12 to pull the voltage on node 13 down to ground potential. Making the low-to-high propagation delay through the overall circuit 1 equal to the high-to-low propagation delay through the overall circuit 1 therefore typically involves balancing the abilities of two different types of transistors (P-channel and N-channel) to switch the voltage on node 13. This is due to the cross-coupled level shifting latch driving the signal to the following output circuitry in a single-ended fashion. Due to the differences in electron and hole mobilities, the P-channel transistor is typically made to be approximately twice as large as its associated N-channel transistor so that the drive strength of the N-channel and P-channel transistors will be balanced where low duty cycle distortion is desired.

In the novel circuit of FIG. 3, on the other hand, cross-coupled level shifting latch 102 drives the following output circuitry in a double-ended fashion. In the circuit of FIG. 3, a low-to-high transition of the input signal IN results in N-channel transistor 116 being made conductive and P-channel transistor 119 being conductive. P-channel transistor 119 being conductive is what pulls the voltage on node 129 to a digital logic high and causes the reset signal to be output onto the reset "R" input lead 120 of the SR latch 103. The rate at which the voltage on node 129 transitions to a digital logic high is therefore dependent upon the ability of a P-channel transistor 119 to turn on and the ability of an N-channel transistor 117 to be turned off. A high-to-low transition of the input signal IN results in N-channel transistor 117 being made conductive and P-channel transistor 118 being made conductive and N-channel transistor 116 being made nonconductive. P-channel transistor 118 being conductive is what pulls the voltage on node 128 to a digital logic high and causes the set signal to be output onto the set "S" input lead 121 of the SR latch 103. The rate at which the voltage on node 128 transitions to a digital logic high is therefore dependent upon the ability of a P-channel transistor 1 18 to turn on and the ability of an N-channel transistor 116 to be turned off. Accordingly, for both a low-to-high transition and for a high-to-low transition of the input signal IN, the rate at which cross-coupled level shifting latch 102 outputs an active high set or reset signal depends on the rate at which an N-channel transistor can turn off and the rate at which an associated P-channel transistor can turn on. Making the low-to-high propagation delay through the overall circuit 100 equal to the high-to-low propagation delay through the overall circuit 100 therefore does not involve balancing the abilities of two different types of transistors (thick-gate P-channel versus thick-gate N-channel) to switch the voltage on a node. The different effects that voltage, process and temperature have on P-channel versus N-channel transistors that led to duty cycle distortion in the prior art circuit of FIG. 1 therefore do not affect the novel level shifter circuit 100 of FIG. 3.

The prior art circuit of FIG. 1 also suffers from another problem. It is often desired that the level shifter circuit 1 continue to operate at low values of a supply voltage such as VDDL. This is referred to as "supply voltage margin". As the value of supply voltage VDDL is reduced, the maximum voltage that inverter 7 can drive the gate of N-channel transistor 10 decreases. Driving the gate of N-channel transistor 10 with lower and lower voltages under the condition when transistor 10 is to be made conductive results in this transistor only being partially on or weakly conductive. Further decreases in the supply voltage VDDL fail to allow N-channel transistor 10 to turn on adequately for the cross-coupled latch to switch. The level shifter circuit therefore stops working. Increasing the size of N-channel transistor 10 increases the amount of current the N-channel transistor 10 will conduct at a given gate drive voltage. Consequently, increasing the size of N-channel transistor 10 serves to improve the supply voltage margin. If however, the turn on and turn off and conduction characteristics of the N-channel and P-channel transistors of the cross-coupled level shifting latch of FIG. 1 are to be balanced to minimize duty cycle distortion as set forth above, then the size of the N-channel transistor 10 cannot be increased without adversely affecting duty cycle distortion. Improving supply voltage margin increases duty cycle distortion, and improving duty cycle distortion decreased supply voltage margin.

In the novel circuit of FIG. 3, on the other hand, the turn on and turn off and conduction characteristics of the N-channel and P-channel transistors 117 and 119 do not need to be balanced. Similarly, the turn on and turn off and conduction characteristics of the N-channel and P-channel transistors 116 and 118 do not need to be balanced. The channel widths of the N-channel transistors 116 and 117 are therefore increased and supply voltage margin is improved as compared to the supply voltage margin of the prior art circuit of FIG. 1. In one example, the channel width of N-channel transistor 117 is larger than the channel width of P-channel transistor 1 19, and the channel width of N-channel transistor 116 is larger than the channel width of P-channel transistor 118.

Figure 6:
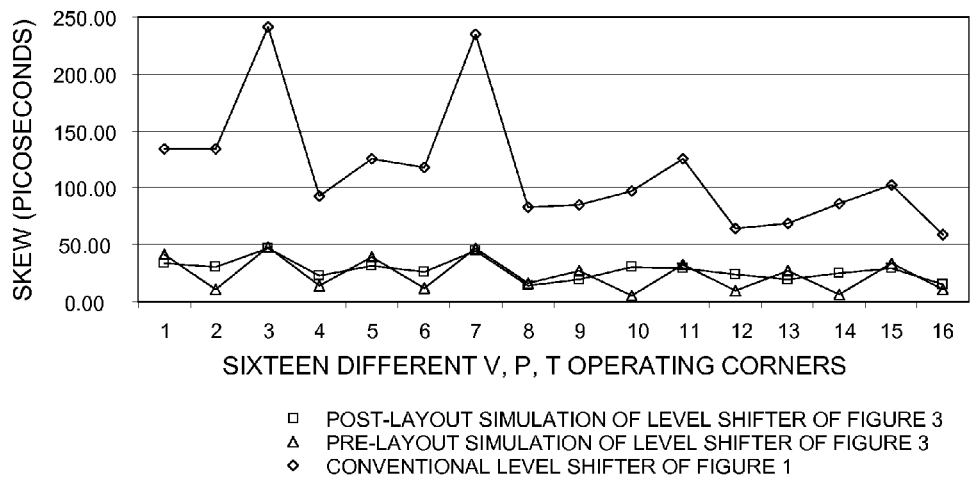
FIG. 6 is a diagram that compares the skew of the novel level shifter circuit 100 of FIG. 3 to the prior art level shifter circuit 1 of FIG. 1 over sixteen different voltage, process and temperature operating corners.

FIG. 6 is a diagram that illustrates the skew of the novel level shifter circuit 100 of FIG. 3 in comparison to the skew of the prior art level shifter circuit 1 of FIG. 1. Skew is the difference in time (picoseconds) between the propagation delay through the circuit for a low-to-high input signal IN and the propagation delay through the circuit for a high-to-low input signal IN. For each of the variables of operating supply voltage(s), process, and operating temperature, there is a minimum permissible value and a maximum permissible value. These are commonly referred to as "corners". Accordingly, there are sixteen different permutations of the high and low values of the three variables. In the example of FIG. 6, the temperature has a minimum of minus 40 degrees Celsius and a maximum of 125 degrees Celsius. VDDL has a minimum of 1.08 volts and a maximum of 1.45 volts (at least plus or minus ten percent). VDDH has a minimum of 1.6 volts and a maximum of 2.0 volts (at least plus or minus ten percent). The process is characterized as being "slow" to "fast". The skew at each of the sixteen permutations is indicated in FIG. 6. For the permutation 1, for example, the prior art level shifter of FIG. 1 has a skew of approximately 130 picoseconds, whereas the novel level shifter circuit 100 of FIG. 3 has a skew of less than 50 picoseconds over all sixteen operating corners.

Figure 7:
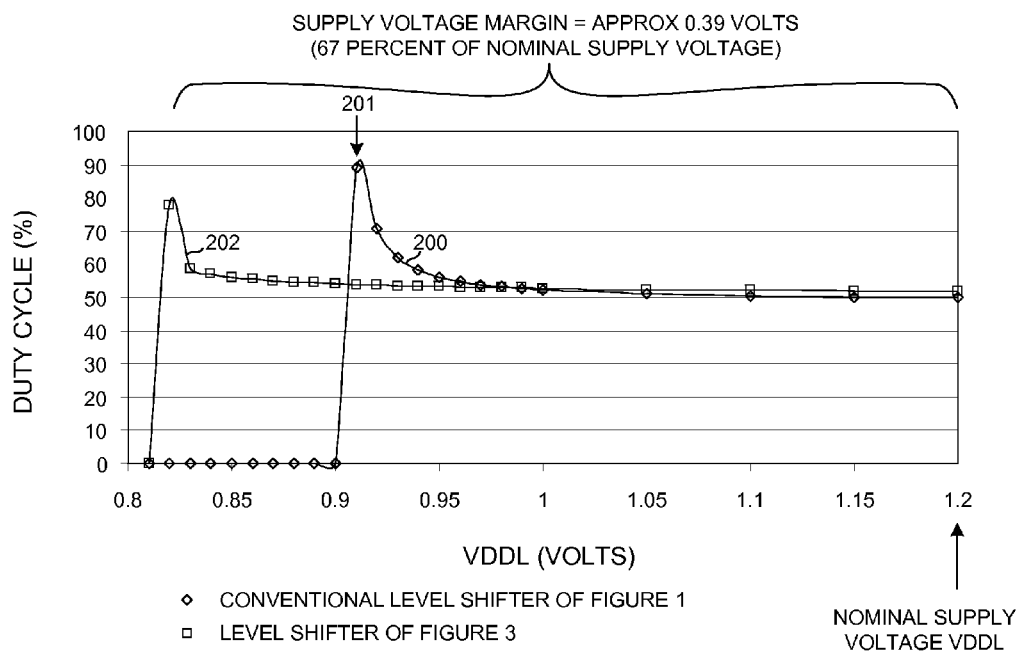
FIG. 7 is a diagram that illustrates the supply voltage margin of the novel level shifter circuit 100 of FIG. 3 and the prior art level shifter circuit 1 of FIG. 1.

FIG. 7 is a diagram that illustrates the supply voltage margin of the novel level shifter circuit 100 of FIG. 3 in comparison to the skew of the prior art level shifter circuit 1 of FIG. 1. Consider the line 200. Line 200 represents operation of the prior art level shifter of FIG. 1. As the magnitude of the supply voltage VDDL is reduced, the duty cycle is fairly constant as indicated by the horizontal orientation of line 200 from 1.2 volts VDDL down to approximately 0.95 volts VDDL. Then for VDDL voltages below approximately 0.95 volts the duty cycle starts to change (duty cycle distortion increases). At point 201, duty cycle distortion is very high, but the level shifter circuit 1 is still transferring the input signal IN to the output node. For supply voltages below approximately 0.95 volts, however, the duty cycle is seen to fall to zero. The prior art level shifter has ceased operating. The supply voltage margin is therefore the nominal supply voltage VDDL value of 1.2 volts minus 0.95 volts, or approximately 0.25 volts. Next, consider the line 202 that represents operation of the novel level shifter of FIG. 3. The supply voltage VDDL can be reduced down to approximately 0.83 volts before duty cycle distortion is seen to increase quickly. The novel level shifter circuit 100 of FIG. 3 continues to operate down to supply voltages VDDL of approximately 0.81 volts. The novel level shifter 100 of FIG. 3 is therefore said to have a supply voltage margin of 1.2 volts minus 0.81 volts or 0.39 volts. A supply voltage margin of 0.39 volts is a substantial improvement over the prior art circuit of FIG. 1 which exhibits a supply voltage margin of approximately 0.25 volts. The supply voltage margin of 0.39 volts is approximately one third (more than one quarter) of the nominal 1.2 volt supply voltage.

As illustrated in FIG. 6, the specific embodiment of the novel level shifter circuit 100 of FIG. 6 has a skew of less than 50 picoseconds over all sixteen process, operating voltage and operating temperature corners, and it accomplishes this while being able to operate down to a supply voltage of approximately 0.81 volts. The channel width of the N-channel transistor of the P-channel and N-channel transistor pair that drives each of the differential output nodes of the cross-coupled latch 102 is at least as large as the channel width of the associated P-channel transistor of the pair.

Figure 8:
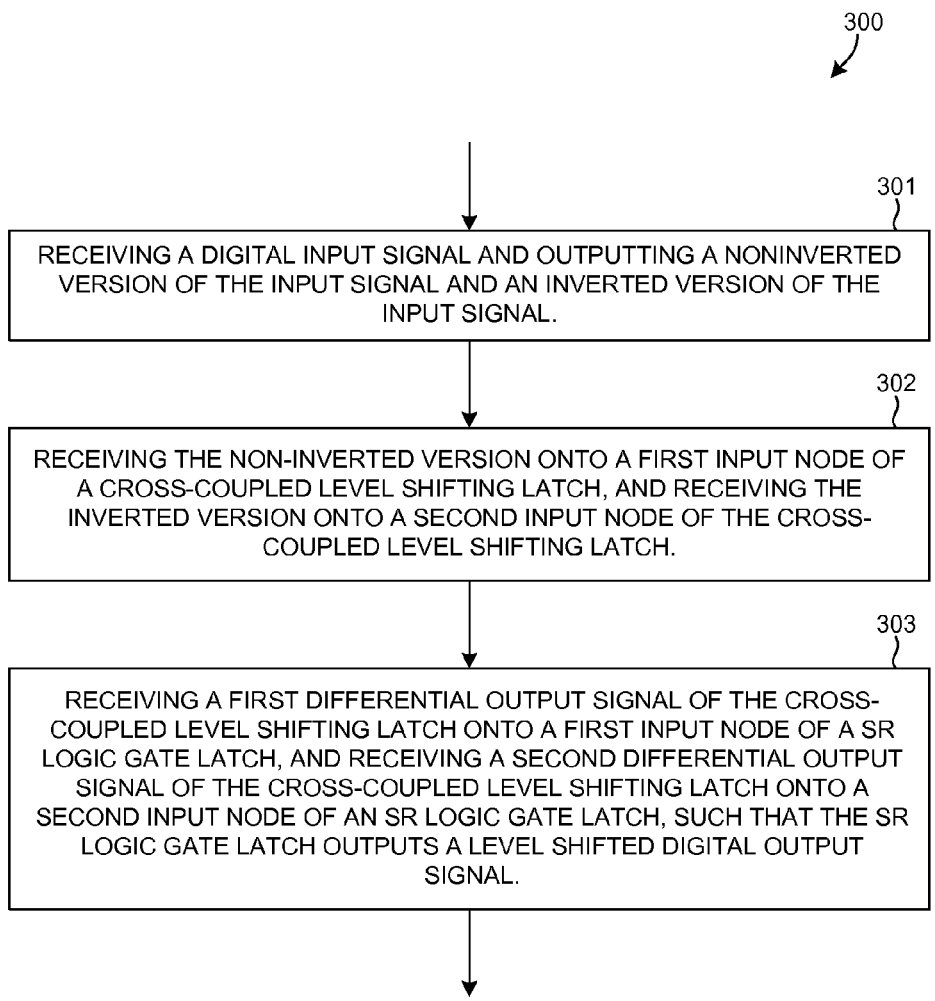
FIG. 8 is a flowchart diagram of a method in accordance with one novel aspect.

FIG. 8 is a flowchart diagram of a method 300 in accordance with one novel aspect. In step 301, a digital input signal is received and inverted and noninverted versions of the digital input signal are output. In one example, inverting circuit 104 of FIG. 3 performs this step. In step 302, the non-inverted version is received onto a first input node of a cross-coupled level shifting latch and the inverted version is received onto a second input node of the cross-coupled level shifting latch. In one example, the cross-coupled level shifting latch is cross-coupled level shifting latch 102 of FIG. 3. In step 303, a first differential output signal of the cross-coupled level shifting latch is received onto a first input node of an SR logic gate latch, and a second differential output signal of the cross-coupled level shifting latch is received onto a second input node of the SR logic gate latch. In one example, the SR logic gate latch is SR logic gate latch 103 of FIG. 3. The SR logic gate latch outputs a level shifted digital output signal (a level shifted version of the digital input signal).

Although certain specific embodiments are described above for instructional purposes, the teachings of this patent document have general applicability and are not limited to the specific embodiments described above. In the description above, two nodes are said to be "coupled" together when they are directly connected by conductors such that the two nodes are actually a single substantially unipotential node. Although a 400 MHz digital input signal is described as being successfully level shifted by the novel level shifting circuit of FIG. 3 with low duty cycle distortion skew, it is to be understood that this frequency of input signal is only used as an example. The circuit of FIG. 3 operates at frequencies higher than 400 MHz. Accordingly, various modifications, adaptations, and combinations of the various features of the described specific embodiments can be practiced without departing from the scope of the claims that are set forth below.

What is claimed is:

1. A level shifter circuit comprising:
   a cross-coupled level shifting latch having a first input node, a second input node, a first differential output node and a second differential output node;
   a set-reset (SR) logic gate latch having a reset input node, a set input node, and an output node, wherein the reset input node is coupled to the second differential output node of the cross-coupled level shifting latch, and wherein the set input node is coupled to the first differential output node of the cross-coupled level shifting latch; and
   an inverting circuit for mitigating duty cycle distortion skew by matching propagation delays of signals passing through the level shifter circuit, the inverting circuit supplying a digital signal onto the first input node of the cross-coupled level shifting latch, and supplying an inverted version of the digital signal onto the second input node of the cross-coupled level shifting latch, wherein the inverting circuit comprises:
   a non-inverting digital logic circuit comprising at least two buffering components to set a propagation delay of a first signal passing through the non-inverting digital logic circuit to the output node of the SR logic gate latch, the non-inverting digital logic circuit having an input node and an output node, wherein the output node is coupled to the first input node of the cross-coupled level shifting latch; and
   an inverting digital logic circuit comprising at least one buffering component to match a propagation delay of a second signal passing through the inverting digital logic circuit to the output node of the SR logic gate latch with the propagation delay of the first signal passing through the non-inverting digital logic circuit to the output node of the SR logic gate latch, the inverting digital logic circuit having an input node and an output node, wherein the input node of the inverting digital logic circuit is the input node of the non-inverting digital logic circuit, wherein the output node is the second input node of the cross-coupled level shifting latch, and wherein the buffering components of the non-inverting digital logic circuit and the inverting digital logic circuit are not shared.

2. The level shifter circuit of claim 1, wherein the cross-coupled level shifting latch comprises:
   a supply voltage node,
   a first P-channel field effect transistor (PFET) having a source, a drain and a gate, wherein the source is coupled to the supply voltage node, and wherein the drain is coupled to the set input node of the SR logic gate latch, and wherein the gate is coupled to the second differential output node;
   a second PFET having a source, a drain and a gate, wherein the source is coupled to the supply voltage node, and wherein the drain is coupled to the reset input node of the SR logic gate latch, and wherein the gate is coupled to the first differential output node;
   a ground node;
   a first N-channel field effect transistor (NFET) having a source, a drain and a gate, wherein the source is coupled to the ground node, wherein the drain is coupled to the drain of the first PFET, and wherein the gate is the first input node of the cross-coupled level shifting latch; and
   a second NFET having a source, a drain and a gate, wherein the source is coupled to the ground node, wherein the drain is coupled to the drain of the second PFET, and wherein the gate is the second input node of the cross-coupled level shifting latch.

3. The level shifter circuit of claim 2, wherein the first NFET has a channel width, wherein the first PFET has a channel width, and wherein the channel width of the first NFET is larger than the channel width of the first PFET.

4. The level shifter circuit of claim 1, wherein the SR logic gate latch comprises:
   a first NOR gate having a first input node, a second input node, and an output node, wherein the first input node is the reset input node of the SR logic gate latch, and wherein the output node is the output node of the SR logic gate latch; and
   a second NOR gate having a first input node, a second input node, and an output node, wherein the first input node is the set input node of the SR logic gate latch, wherein the second input node is the output node of the first NOR gate, and wherein the output node is the second input node of the first NOR gate.

5. The level shifter circuit of claim 4, wherein a first signal passing through the non-inverting digital logic circuit from the input node of the non-inverting digital logic circuit to the output node of the non-inverting digital logic circuit has a first propagation delay, wherein a second signal passing through the inverting digital logic circuit from the input node of the inverting digital logic circuit to the output node of the inverting digital logic circuit has a second propagation delay, and wherein the second propagation delay is shorter than the first propagation delay.

6. The level shifter circuit of claim 1, wherein the SR logic gate latch comprises two cross-coupled NOR gates, the non-inverting digital logic circuit comprises two series-coupled inverters, and at least one NOR gate is configured to have a propagation delay substantially equal to a propagation delay of at least one of the inverters.

7. The level shifter circuit of claim 4, wherein the non-inverting digital logic circuit comprises two series-coupled inverters, and wherein the second NOR gate of the SR logic gate latch is configured to have a prorogation delay substantially equal to a propagation delay of one of the inverters.

8. A level shifter circuit comprising:
   a cross-coupled level shifting latch having a first input node, a second input node, a first differential output node and a second differential output node;
   a set-reset (SR) logic gate latch having a reset input node, a set input node, and an output node, wherein the reset input node is coupled to the second differential output node of the cross-coupled level shifting latch, and wherein the set input node is coupled to the first differential output node of the cross-coupled level shifting latch; and an inverting circuit that supplies a digital signal onto the first input node of the cross-coupled level shifting latch, and that supplies an inverted version of the digital signal onto the second input node of the cross-coupled level shifting latch, wherein the inverting circuit is powered from a supply voltage, and wherein the level shifter circuit has a duty cycle distortion skew of less than fifty picoseconds over a semiconductor processing variation range, over a 165 degree Celsius operating temperature range, and over a plus or minus ten percent range of the supply voltage.

9. A level shifter circuit comprising:

a cross-coupled level shifting latch having a first input node, a second input node, a first differential output node and a second differential output node;

a set-reset (SR) logic gate latch having a reset input node, a set input node, and an output node, wherein the reset input node is coupled to the second differential output node of the cross-coupled level shifting latch, and wherein the set input node is coupled to the first differential output node of the cross-coupled level shifting latch; and an inverting circuit that supplies a digital signal onto the first input node of the cross-coupled level shifting latch, and that supplies an inverted version of the digital signal onto the second input node of the cross-coupled level shifting latch;

wherein the cross-coupled level shifting latch comprises:

a supply voltage node, a first P-channel field effect transistor (PFET) having a source, a drain and a gate, wherein the source is coupled to the supply voltage node, and wherein the drain is coupled to the set input node of the SR logic gate latch, and wherein the gate is coupled to the second differential output node;

a second PFET having a source, a drain and a gate, wherein the source is coupled to the supply voltage node, and wherein the drain is coupled to the reset input node of the SR logic gate latch, and wherein the gate is coupled to the first differential output node;

a ground node;

a first N-channel field effect transistor (NFET) having a source, a drain and a gate, wherein the source is coupled to the ground node, wherein the drain is coupled to the drain of the first PFET, and wherein the gate is the first input node of the cross-coupled level shifting latch; and a second NFET having a source, a drain and a gate, wherein the source is coupled to the ground node, wherein the drain is coupled to the drain of the second PFET, and wherein the gate is the second input node of the cross-coupled level shifting latch;

wherein the first NFET has a channel width, wherein the first PFET has a channel width, and wherein the channel width of the first NFET is larger than the channel width of the first PFET;

wherein the level shifter circuit has a duty cycle distortion skew of less than fifty picoseconds when the level shifter circuit is receiving an input signal of four hundred megahertz and outputting an output signal of four hundred megahertz, wherein the inverting circuit is powered by a first supply voltage, wherein the cross-coupled level shifting latch and the SR logic gate latch are powered by a second supply voltage, and wherein the level shifter circuit has the duty cycle distortion skew of less than fifty picoseconds over conditions of the first supply voltage varying plus or minus ten percent, and over conditions of the second supply voltage varying plus or minus ten percent, and wherein the level shifter circuit has the duty cycle distortion skew of less than fifty picoseconds over a 165 degree Celsius temperature range.

10. A level shifter circuit comprising:

a cross-coupled level shifting latch having a first input node, a second input node, a first differential output node and a second differential output node;

a set-reset (SR) logic gate latch having a reset input node, a set input node, and an output node, wherein the reset input node is coupled to the second differential output node of the cross-coupled level shifting latch, and wherein the set input node is coupled to the first differential output node of the cross-coupled level shifting latch; and an inverting circuit that supplies a digital signal onto the first input node of the cross-coupled level shifting latch, and that supplies an inverted version of the digital signal onto the second input node of the cross-coupled level shifting latch, wherein the inverting circuit is powered by a first supply voltage, wherein the cross-coupled level shifting latch is powered by a second supply voltage, and wherein the level shifter circuit has a duty cycle distortion skew of less than fifty picoseconds when the level shifter circuit is receiving an input signal of four hundred megahertz and outputting an output signal of four hundred megahertz, and wherein the level shifter circuit has the duty cycle distortion skew of less than fifty picoseconds over conditions of the first supply voltage varying plus or minus ten percent, and over conditions of the second supply voltage varying plus or minus ten percent, and wherein the level shifter circuit has the duty cycle distortion skew of less than fifty picoseconds over a 165 degree Celsius temperature range.

11. A method for a level shifter circuit comprising:

receiving an input signal onto an input node of an inverting circuit and outputting a noninverted version of the input signal and an inverted version of the input signal, wherein the inverted and noninverted versions of the input signal are digital signals whose voltages range from a ground potential to a first supply voltage;

receiving the noninverted version of the input signal onto a first input node of a cross-coupled level shifting latch, and receiving the inverted version of the input signal onto a second input node of the cross-coupled level shifting latch, wherein the cross-coupled level shifting latch outputs a first differential output signal, and a second differential output signal; and receiving the first differential output signal onto a first input node of a set-reset (SR) logic gate latch, and receiving the second differential output signal onto a second input node of the SR logic gate latch, wherein the SR logic gate latch outputs at an output node a level shifted digital output signal whose voltage ranges from the ground potential to a second supply voltage, wherein the inverting circuit mitigates duty cycle distortion skew by matching propagation delays of signals passing through the level shifter circuit and comprises:

a non-inverting digital logic circuit comprising at least two buffering components to set a propagation delay of a first signal passing through the non-inverting digital logic circuit to the output node of the SR logic gate latch, the non-inverting digital logic circuit having an input node and an output node, wherein the output node is coupled to the first input node of the cross-coupled level shifting latch; and an inverting digital logic circuit comprising at least one buffering component to match a propagation delay of a second signal passing through the inverting digital logic circuit to the output node of the SR logic gate latch with the propagation delay of the first signal passing through the non-inverting digital logic circuit to the output node of the SR logic gate latch, the inverting digital logic circuit having an input node and an output node, wherein the input node of the inverting digital logic circuit is the input node of the non-inverting digital logic circuit, wherein the output node is the second input node of the cross-coupled level shifting latch, and wherein the buffering components of the non-inverting digital logic circuit and the inverting digital logic circuit are not shared.

12. A method comprising:

receiving an input signal and outputting a noninverted version of the input signal and an inverted version of the input signal, wherein the inverted and noninverted versions of the input signal are digital signals whose voltages range from a ground potential to a first supply voltage;

receiving the noninverted version of the input signal onto a first input node of a cross-coupled level shifting latch, and receiving the inverted version of the input signal onto a second input node of the cross-coupled level shifting latch, wherein the cross-coupled level shifting latch outputs a first differential output signal and a second differential output signal; and receiving the first differential output signal onto a first input node of a set-reset (SR) logic gate latch, and receiving the second differential output signal onto a second input node of the SR logic gate latch, wherein the SR logic gate latch outputs a level shifted digital output signal whose voltage ranges from the ground potential to a second supply voltage, wherein there is a maximum duty cycle distortion skew in the output signal when the input signal is a four hundred megahertz signal, and wherein the maximum duty cycle distortion skew is less than fifty picoseconds over a 165 degree Celsius temperature range and under conditions of the first supply voltage varying plus or minus ten percent and under conditions of the second supply voltage varying plus or minus ten percent.

13. A method for a level shifter circuit comprising:

receiving an input signal onto an input node of an inverting circuit and outputting a noninverted version of the input signal and an inverted version of the input signal, wherein the inverted and noninverted versions of the input signal are digital signals whose voltages range from a ground potential to a first supply voltage;

receiving a low-to-high transition of a digital input signal and in response thereto supplying a digital logic high signal onto a first input node of a set-reset (SR) logic gate latch such that the SR logic gate latch switches states and causes a digital output signal at an output node to transition, wherein the digital input signal transitions from approximately ground potential to approximately a first supply voltage, and wherein the SR logic gate latch is powered by a second supply voltage; and receiving a high-to-low transition of the digital input signal and in response thereto supplying a digital logic high signal onto a second input node of the SR logic gate latch such that the SR logic gate latch switches states and causes the digital output signal to transition, wherein the inverting circuit mitigates duty cycle distortion skew by matching propagation delays of signals passing through the level shifter circuit and comprises:

a non-inverting digital logic circuit comprising at least two buffering components to set a propagation delay of a first signal passing through the non-inverting digital logic circuit to the output node of the SR logic gate latch, the non-inverting digital logic circuit having an input node and an output node, wherein the output node is coupled to the first input node of the cross-coupled level shifting latch; and an inverting digital logic circuit comprising at least one buffering component to match a propagation delay of a second signal passing through the inverting digital logic circuit to the output node of the SR logic gate latch with the propagation delay of the first signal passing through the non-inverting digital logic circuit to the output node of the SR logic gate latch, the inverting digital logic circuit having an input node and an output node, wherein the input node of the inverting digital logic circuit is the input node of the non-inverting digital logic circuit, wherein the output node is the second input node of the cross-coupled level shifting latch, and wherein the buffering components of the non-inverting digital logic circuit and the inverting digital logic circuit are not shared.

14. The method of claim 13, wherein the SR logic gate latch includes a first NOR gate and a second NOR gate, wherein the first input node of the SR logic gate latch is a first input node of the first NOR gate, wherein the second input node of the SR logic gate latch is a first input node of the second NOR gate, wherein a second input node of the first NOR gate is coupled to an output node of the second NOR gate, and wherein a second input node of the second NOR gate is coupled to an output node of the first NOR gate.

15. A level shifter circuit comprising:

a set-reset (SR) logic gate latch having a set input node, a reset input node, and an output node, wherein a digital output signal having a second signal voltage range is present on the output node, wherein the SR logic gate latch is powered by a supply voltage; and means for receiving a digital logic input signal having a first signal voltage range and in response thereto driving the set input node and driving the reset input node such that: 1) a low-to-high transition of the digital logic input signal causes the SR logic gate latch to be reset and causes the digital output signal to transition after a first propagation delay time, and 2) a high-to-low transition of the digital logic input signal causes the SR logic gate latch to be set and causes the digital output signal to transition after a second propagation delay time, wherein a maximum skew between the first and second propagation delay times is less than fifty picoseconds over a 165 degree Celsius temperature range and under conditions of the supply voltage varying plus or minus ten percent.

16. The level shifter circuit of claim 15, wherein the means includes a pair of field effect transistors whose drains are directly coupled to the set input node, wherein a first of the field effect transistors of the pair is a P-channel transistor having a channel width, wherein a second of the field effect transistors of the pair is an N-channel transistor having a channel width, and wherein the channel width of the N-channel transistor is larger than the channel width of the P-channel transistor.

17. The level shifter circuit of claim 15, wherein the means includes digital logic that is powered by another supply voltage, and wherein the maximum skew of less fifty picoseconds is over a 165 degree Celsius temperature range and under conditions of said another supply voltage varying plus or minus ten percent.

18. The level shifter circuit of claim 17, wherein the level shifter circuit has a supply voltage margin of more than one quarter of a nominal value of said another supply voltage.

19. The level shifter circuit of claim 17, wherein the means comprises:
   an inverting circuit that receives the digital logic input signal and that outputs an inverted version of the digital logic input signal and that also outputs a noninverted version of the digital logic input signal; and
   a cross-coupled level shifting latch having a first input node, and second input node, a first differential output node and a second differential output node, wherein the first input node is coupled to receive the noninverted version of the digital logic input signal, wherein the second input node is coupled to receive the inverted version of the digital logic input signal, wherein the first differential output node is coupled to the set input node of the SR logic gate latch, and wherein the second differential output node is coupled to the reset input node of the SR logic gate latch.

20. The level shifter circuit of claim 15, wherein the SR logic gate latch comprises two cross-coupled NOR gates.

* * * * *